(12) United States Patent
Takeda et al.

(10) Patent No.: US 8,897,334 B2
(45) Date of Patent: Nov. 25, 2014

(54) LIGHT EMITTING DEVICE

(75) Inventors: Yuji Takeda, Yokosuka (JP); Junichi Kinoshita, Yokosuka (JP)

(73) Assignee: Toshiba Lighting & Technology Corporation, Yokosuka-shi, Kanagawa-ken (JP)

( * ) Notice: Subject to any disclaimer, the term of this patent is extended or adjusted under 35 U.S.C. 154(b) by 0 days.

(21) Appl. No.: 14/342,937

(22) PCT Filed: Feb. 7, 2012

(86) PCT No.: PCT/JP2012/052785
§ 371 (c)(1),
(2), (4) Date: Mar. 5, 2014

(87) PCT Pub. No.: WO2013/054547
PCT Pub. Date: Apr. 18, 2013

(65) Prior Publication Data
US 2014/0226689 A1    Aug. 14, 2014

(30) Foreign Application Priority Data
Oct. 11, 2011 (JP) .................. 2011-224264

(51) Int. Cl.
| | | |
|---|---|---|
| H01S 5/00 | (2006.01) | |
| H01S 3/097 | (2006.01) | |
| H01S 5/022 | (2006.01) | |
| H01S 5/042 | (2006.01) | |
| H01S 5/024 | (2006.01) | |
| H01S 5/028 | (2006.01) | |

(52) U.S. Cl.
CPC .............. *H01S 5/022* (2013.01); *H01S 5/0425* (2013.01); *H01S 5/005* (2013.01); *H01S 5/02236* (2013.01); *H01S 5/02276* (2013.01); *H01S 5/02296* (2013.01); *H01S 5/02476* (2013.01); *H01S 5/0287* (2013.01)
USPC .......................... 372/87; 372/43.01; 372/81

(58) Field of Classification Search
CPC .... H01S 5/022; H01S 5/02276; H01S 5/0425
USPC ............................. 372/43.01, 81, 87
See application file for complete search history.

(56) References Cited

FOREIGN PATENT DOCUMENTS

| | | |
|---|---|---|
| JP | 2001-052364 A | 2/2001 |
| JP | 2004-309506 A | 11/2004 |
| JP | 2005-333014 A | 12/2005 |
| JP | 2009-283735 A | 12/2009 |

OTHER PUBLICATIONS

International Search Report received in corresponding International Application No. PCT/JP2012/052785 mailed Mar. 6, 2012.

*Primary Examiner* — Armando Rodriguez
(74) *Attorney, Agent, or Firm* — Banner & Witcoff, Ltd.

(57) ABSTRACT

A light emitting device includes first and second electrodes, a semiconductor laser element, a bonding wire, a transparent frame section, and a lid section. The first electrode includes a convex section, a bottom surface surrounding the convex section, and a first surface. The second electrode includes a first surface opposed to the bottom surface of the first electrode and a second surface. The second electrode includes an opening section and a step section receding toward the first surface from the second surface. The semiconductor laser element is provided on the convex section and includes a light-emitting layer. The bonding wire is capable of electrically connecting the semiconductor laser element and the step section. The transparent frame section surrounds the convex section and is bonded to the bottom surface and the first surface of the second electrode. The lid section is bonded to the second surface of the second electrode.

7 Claims, 7 Drawing Sheets

LIGHT EMITTING DEVICE

TECHNICAL FIELD

Embodiments of the present invention relate to a light emitting device.

BACKGROUND ART

In a light-emitting element (LED: Light Emitting Diode) of a surface emitting type, on the upper surface or the lower surface of which an electrode is provided, a part of emitted light is blocked by the electrode. The light-emitting element has a poor thermal conduction property and has a limit in an increase of current density.

The light-emitting element of the surface emitting type includes a Lambertian radiation pattern. The full width at half maximum of the Lambertian radiation pattern is as wide as, for example, 120 degrees. Therefore, it is difficult to narrow emitted light.

On the other hand, a semiconductor laser (a Diode Laser or a Laser Diode: LD) can emit laser light having sharp directivity from a very small light emitting region of a side surface. Therefore, for example, an optical fiber or the like having a small incident sectional area is used as a light guide member for guiding laser light and a wavelength conversion material (a phosphor, etc.) provided in a position away from a light-emitting element is excited by the laser light to emit light. Consequently, the semiconductor laser can be applied as an excitation light emission source that causes a region corresponding to the length and the width of the phosphor to emit light. The excitation light emission source can be used in a fog lamp for an automobile, a backlight light source of a display device, an optical sensor light source, a linear light source for an image reading device, a light source for general lighting, and the like.

In such uses, a light emitting device excellent in a reduction in size, a thermal conduction property, and a mounting property and rich in reliability is necessary.

CITATION LIST

Patent Literature

Patent Literature 1: JP-A-2005-333014

SUMMARY OF INVENTION

Technical Problem

It is an object of the present invention to provide a light emitting device not requiring high component accuracy and rich in mass productivity.

Solution to Problem

A light emitting device in an embodiment of the present invention includes a first electrode, a second electrode, a semiconductor laser element, a bonding wire, a transparent frame section, and a lid section. The first electrode includes a convex section, a bottom surface surrounding the convex section, and a rear surface on the opposite side of the bottom surface. The second electrode includes a first surface opposed to the bottom surface of the first electrode and a second surface on the opposite side of the first surface. The second electrode includes an opening section and a step section receding in the direction of the first surface from the second surface. The semiconductor laser element is provided on the convex section and includes a light-emitting layer. The bonding wire is capable of electrically connecting the semiconductor laser element and the step section provided in the second electrode. The transparent frame section surrounds the convex section and the semiconductor laser element and is made of glass. The transparent frame section is bonded to the bottom surface and bonded to the first surface of the second electrode. The lid section is bonded to the second surface of the second electrode. A light component within a full width at half maximum in laser light emitted from the semiconductor laser element can be emitted to an outside from the transparent frame section.

Advantageous Effect of Invention

There is provided a light emitting device not requiring high component accuracy and rich in mass productivity.

DESCRIPTION OF EMBODIMENTS

Embodiments of the present invention are explained below with reference to the drawings.

Figure 1A:
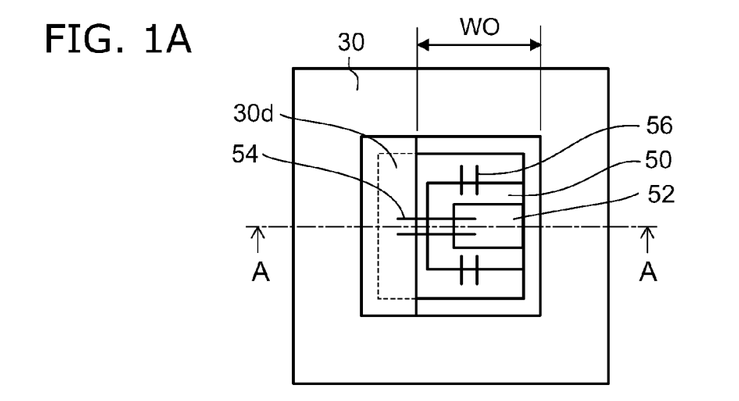
FIG. 1A is a schematic plan view of a light emitting device according to a first embodiment.
Figure 1B:
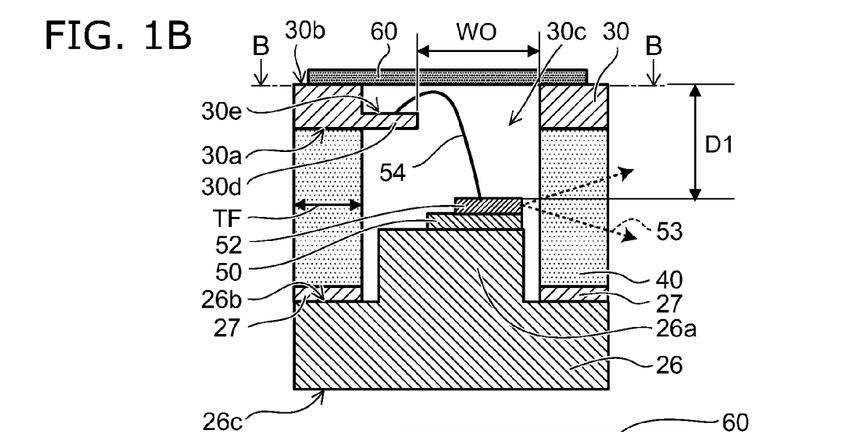
FIG. 1B is a schematic sectional view taken along A-A.
Figure 1C:
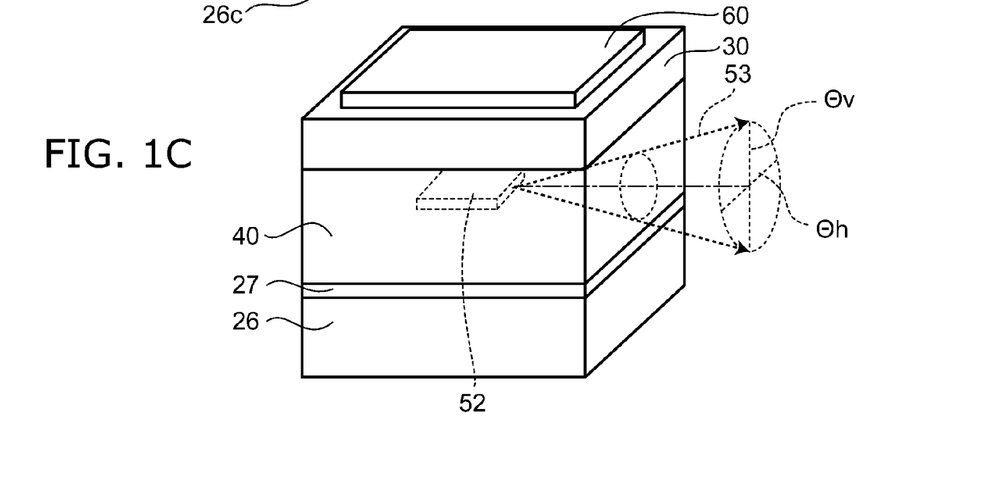
FIG. 1C is a schematic perspective view for explaining the spread of laser light.

FIG. 1A is a schematic plan view of a light emitting device according to a first embodiment, FIG. 1B is a schematic sectional view taken along A-A, and FIG. 1C is a schematic perspective view for explaining the spread of laser light.

The light emitting device includes a first electrode 26, a second electrode 30, a semiconductor laser element 52, a transparent frame section 40, and a lid section 60. Note that FIG. 1A is a schematic plan view taken along line B-B and shows a state in which the lid section 60 is not provided.

The first electrode 26 includes a convex section 26a, a bottom surface 26b around the convex section 26a, and a rear surface 26c on the opposite side of the bottom surface 26b. A sub-mount 50 made of ceramic or the like can be provided on the convex section 26a. A semiconductor laser element 52 can be provided on the sub-mount 50. When the sub-mount 52 is provided, it is possible to reduce stress applied to the semiconductor laser element 52 according to, for example, a difference in a coefficient of linear expansion between the convex section 26a made of metal and the semiconductor laser element 52. Therefore, it is possible to improve reliability.

The second electrode 30 includes a first surface 30a opposed to the bottom surface 26b of the first electrode 26 and a second surface 30b on the opposite side of the first surface 30a. An opening section 30c and a step section 30d are provided in the second electrode 30. The step section 30d recedes in the direction of the first surface 30a from the second surface 30b and is formed such that at least a part of the step section 30d appears on the inner side of the opening section 30c.

The semiconductor laser 52 is connected to the first electrode 26 by a bonding wire 56. The semiconductor laser 52 is connected to the second electrode 30 by a bonding wire 54. If the sub-mount 50 is conductive, the rear surface of the semiconductor laser element 52 and the convex section 26a can conduct each other. Therefore, the bonding wire 56 can be omitted. If the sub-mount 50 is insulative, the semiconductor leaser element 52 is bonded on a conductive layer on the surface of the sub-mount 50. Further, the conductive layer and the convex section 26a are connected by the bonding wire 56. Consequently, it is possible to connect one electrode of the semiconductor laser element 52 and the first electrode 26.

The other electrode of the semiconductor laser element 52 and an upper surface 30e of the step section 30d of the second electrode 30 can be directly connected by the bonding wire 54. It is also possible that a conductive section is provided on the sub-mount 50, the other electrode of the semiconductor laser element 52 and the conductive section are connected by a first bonding wire, and the conductive section and the upper surface 30e of the step section 30d are connected by a second bonding wire.

When wire bonding is performed using a gold wire or the like, for example, a gold wire having a diameter of, for example, 10 to 30 μm is pressed against the conductive section or the like in a state in which the gold wire is inserted through a hole section of a capillary. That is, the capillary needs to be inserted into the opening section 30c provided in the second electrode 30 and reach the electrode on the upper surface of the semiconductor laser element 52. Therefore, width WO of the opening section 30c is preferably equal to or larger than, for example, 0.5 mm. A distance D1 between the second surface 30b of the second electrode 30 and the upper surface of the semiconductor laser element 52 is equal to or smaller than, for example, 2 mm.

The transparent frame section 40 made of borosilicate glass or the like is provided to surround the convex section 26a and the semiconductor laser element 52. If thickness TF in the lateral direction of the transparent frame section 40 is set to be equal to or larger than, for example, 0.2 mm, bonding strength with the first electrode 26 can be kept high. Note that the coefficient of linear expansion of the borosilicate glass is near $5.2 \times 10^{-6} \text{ K}^{-1}$.

The bottom surface 26a of the first electrode 26 and the first surface 30a of the second electrode 30 and the entire peripheries of both side ends of the transparent frame section 40 are bonded to each other. Further, the lid section 60 is provided on the second surface 30b of the second electrode 30 to cover the opening section 30c. A package configured in this way can seal the semiconductor laser element 52 on the inside of the package. The lid section 60 can be made of Kovar, iron, or the like.

The first electrode 26 can be made of molybdenum, copper, a copper alloy, or the like. The second electrode 30 can be made of Kovar, iron, molybdenum, or the like. The coefficient of linear expansion of Kovar is, for example, $5.7 \times 10^{-6} \text{ K}^{-1}$. The coefficient of linear expansion of molybdenum is, for example, $5.1 \times 10^{-6} \text{K}^{-1}$. That is, the coefficients of linear expansion of Kovar and molybdenum are close to the coefficient of linear expansion of the borosilicate glass.

When the materials having the close coefficients of linear expansion are bonded using AuSn solder or AuGe solder, a fracture or a crack is suppressed from occurring in the borosilicate glass. As a result, the semiconductor laser element 52 on the inside can be more hermetically sealed by the first electrode 26, the second electrode 30, and the transparent frame section 40. Therefore, it is possible to keep high reliability.

When the convex section 26a of the first electrode 26 and a region below the convex section 26a are made of copper or a copper alloy, it is possible to improve a thermal radiation property. The heat conductivity of molybdenum is 138 W/m·K. On the other hand, the heat conductivity of copper is 401 W/m·K and the heat conductivity of the copper alloy (containing 2.3 wt % of iron, 0.1 wt % of zinc, and 0.03 wt % of phosphorus) is 262 W/m·K. The thermal conductivities of copper and the copper alloy are higher than the heat conductivity of molybdenum. However, the coefficient of linear expansion of copper is near $16.5 \times 10^{-6} \text{ K}^{-1}$, which is about 3.2 times as high as the coefficient of linear expansion of the borosilicate glass. In this case, when a metal thin plate 27 made of Kovar or molybdenum is further provided between the transparent frame section 40 made of the borosilicate glass and a copper plate or a copper alloy plate, the copper plate or the copper alloy plate can be surely bonded to the transparent frame section 40.

The semiconductor laser element 52 is made of a material such as a InGaAlN-based, InAlGaP-based, or GaAlAs-based material.

Note that, in this description, the InGaAlN-based material is represented by a composition formula $In_xGa_yAl_{1-x-y}N$ ($0 \le x \le 1$, $0 \le y \le 1$, $x+y \le 1$) and may contain an element serving as an acceptor or a donor. The InAlGaP-based material is represented by a composition formula $In_x(Al_yGa_{1-y})_{1-x}P$ ($0 \le x \le 1$, $0 \le y \le 1$) and may contain an element serving as an acceptor or a donor. Further, the AlGaAs-based material is represented by a composition formula $Al_xGa_{1-x}As$ ($0 \le x \le 1$) and may contain an acceptor or a donor.

When the height of the convex section 26a of the first electrode 26 is reduced, it is possible to reduce the height of the light emitting device.

Figure 2:
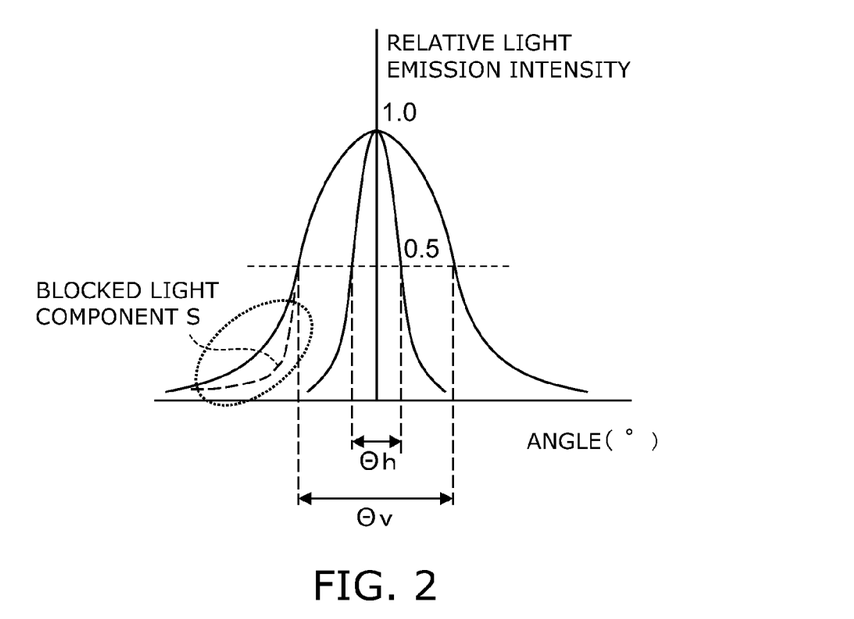
FIG. 2 is a graph for explaining a far-field pattern of laser light.

FIG. 2 is a graph for explaining a far-field pattern of laser light.

The ordinate represents relative light emission efficiency and the abscissa represents an angle (degree) from an optical axis. The far-field pattern (FFP) indicates the spread of laser light 53 emitted from the semiconductor laser element 52 (FIG. 1A). For example, a full width at half maximum Θv of the laser light 53 in the vertical direction with respect to the element surface of the semiconductor laser element 52 is about 30 degrees and a full width at half maximum Θh of the laser light 53 in the horizontal direction with respect to the element surface is about 10 degrees.

In the laser light 53, light components at the full widths at half maximum Θv and Θh are preferably emitted to the outside from the transparent frame section 40 without being blocked by the first electrode 26 and the second electrode 30.

Note that the side surface of the semiconductor laser element 52 is usually formed as a cleavage surface and is formed as a mirror surface that configures an optical resonator. For example, when the reflectance of an emission surface of the laser light 53 is set to 5 to 30% and the reflectance of a reflection surface on the opposite side of the emission surface is set to 90% or higher, it is possible to increase an output from the emission surface.

As viewed from above, the light emitting device may have a columnar shape, an elliptical columnar shape, a polygonal prism shape, or the like rather than a prism shape.

Figure 3:
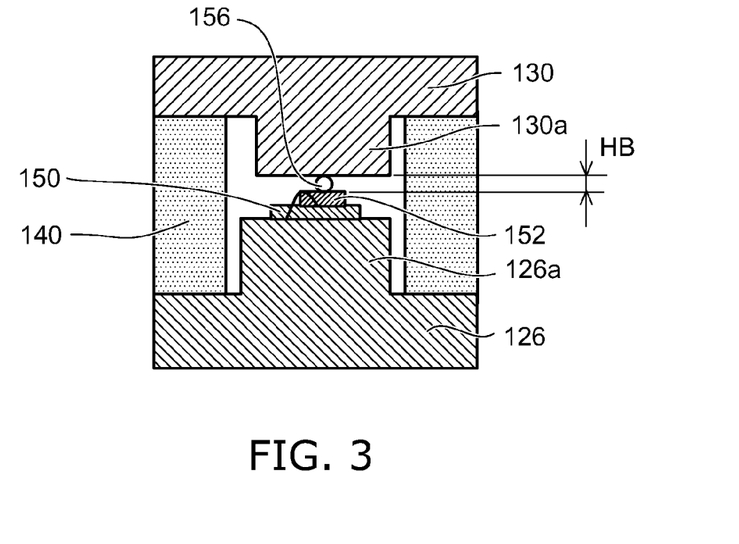
FIG. 3 is a schematic sectional view of the light emitting device according to a comparative example.

FIG. 3 is a schematic sectional view of a light emitting device according to a comparative example.

In the light emitting device according to the comparative example, a first electrode 126 includes a convex section 126a and a second electrode 30 includes a convex section 130a. A semiconductor laser element 152 is provided on a sub-mount 150 provided on the convex section 126a. An upper electrode of the semiconductor laser element 152 is electrically connected by an Au bump 156 pressed against the upper electrode from the convex section 130a side. In this structure, height HB of the Au bump 156 is requested to have high component accuracy such as about 10 μm. Therefore, a process is complicated and it is difficult to keep assembly yield high.

On the other hand, in the first embodiment, by inserting the capillary into the opening section 30c provided in the second electrode 30, the semiconductor laser element 52 and the step section 30d can be connected by the wire bonding surely and with high productivity.

Figure 4A:
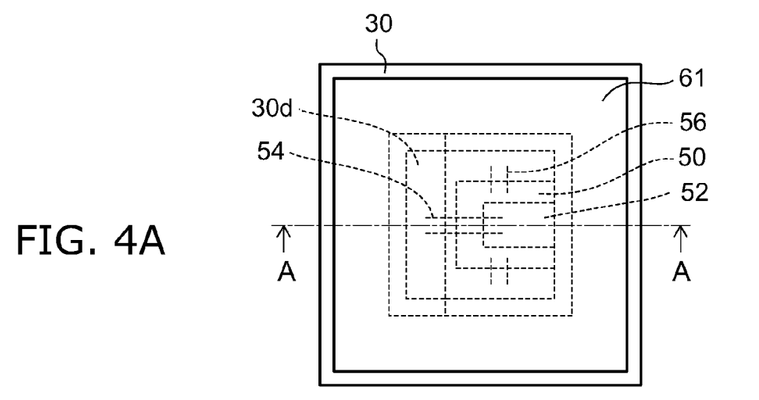
FIG. 4A is a schematic plan view of a light emitting device according to a second embodiment.
Figure 4B:
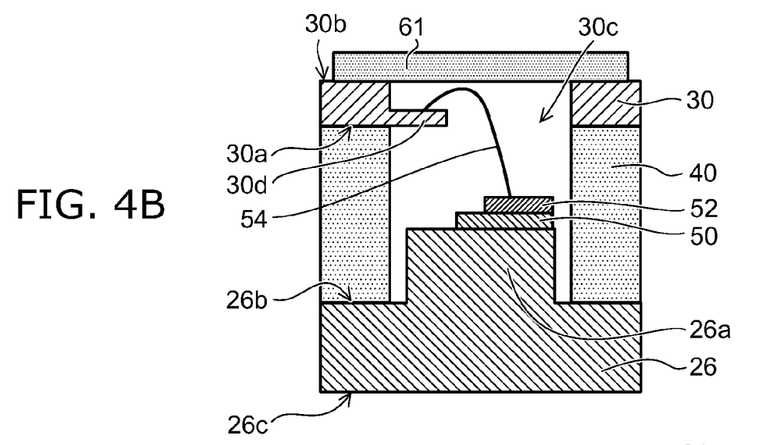
FIG. 4B is a schematic sectional view taken along line A-A.
Figure 4C:
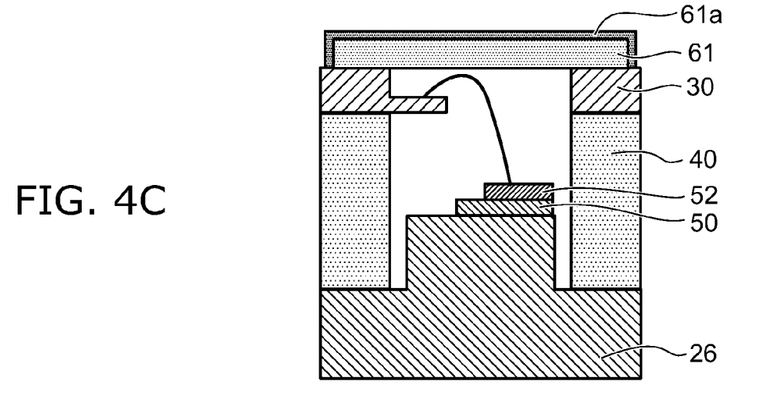
FIG. 4C is a schematic sectional view according to a modification of the second embodiment.

FIG. 4A is a schematic plan view of a light emitting device according to a second embodiment. FIG. 4B is a schematic sectional view taken along line A-A. FIG. 4C is a schematic sectional view according to a modification of the second embodiment.

The lid section 60 may be a transparent material made of glass or the like. When the lid section 60 having translucency is used, the upper surface 30e of the step section 30d can be seen from the outer side of the package through the lid section 60. Therefore, since it is possible to visually inspect, for example, whether the bonding wire 54 is surely connected to the upper surface 30e of the step section 30d, it is possible to eliminate a deficiency due to a mounting process or the like.

When a transparent conductive film 60a made of ITO (Indium Tin Oxide) or the like is provided on the surface of the lid section 60 having transparency, the lid section 60 can be conducted with the second electrode 30. Therefore, it is easy to electrically connect the light emitting device and a mounted substrate.

Figure 5A:
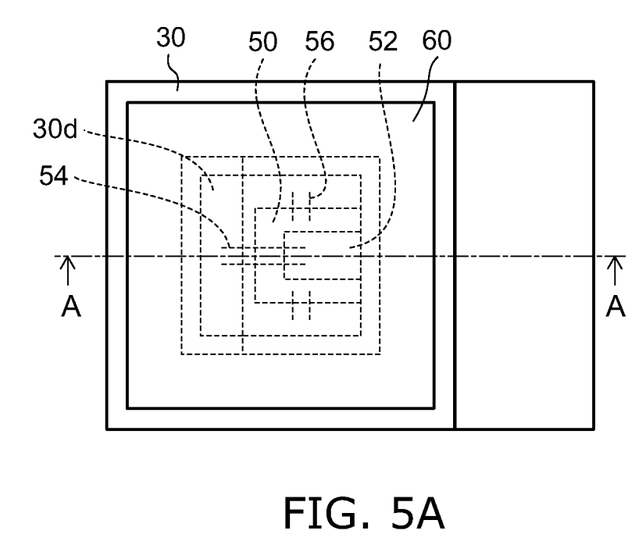
FIG. 5A is a schematic plan view of a light emitting device according to a third embodiment and FIG. 5B is a schematic sectional view taken along line A-A.
Figure 5B:
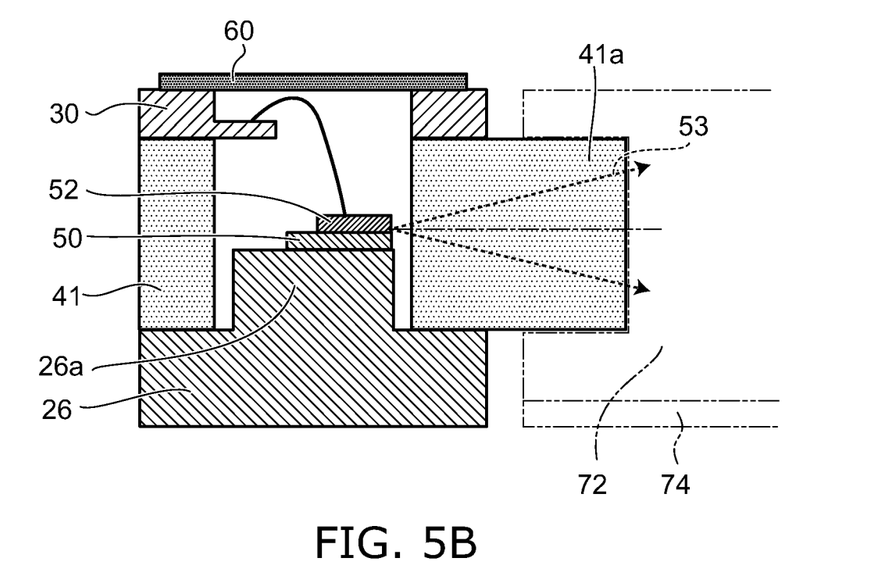

FIG. 5A is a schematic plan view of a light emitting device according to a third embodiment. FIG. 5B is a schematic sectional view taken along line A-A.

A transparent frame section 41 on an emission side of the laser light 53 includes a projecting section 41a projecting further outward than an outer edge in a side surface direction of the first and second electrodes 26 and 30. Consequently, it is possible to fit a light guide body 72 including a concave section and the projecting section 41a with each other to configure a linear luminaire.

Since light density on the surface of the projecting section 41a is reduced, even if the light guide body 72 is made of resin, for example, deterioration of the resin due to light irradiation is suppressed. In this case, when a phosphor layer 74 is provided along an extending direction of the light guide body 72, it is possible to emit mixed light of the laser light 53 and wavelength converted light by the phosphor layer 74 to the outside.

Figure 6A:
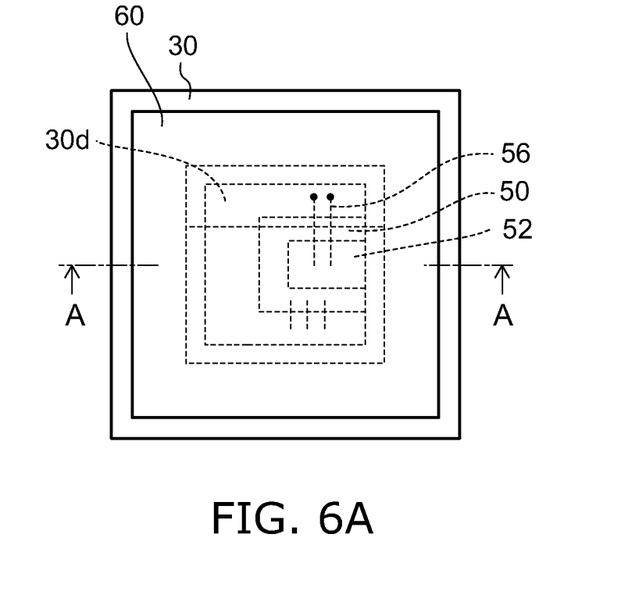
FIG. 6A is a schematic plan view of a light emitting device according to a fourth embodiment and FIG. 6B is a schematic sectional view taken along line A-A.
Figure 6B:
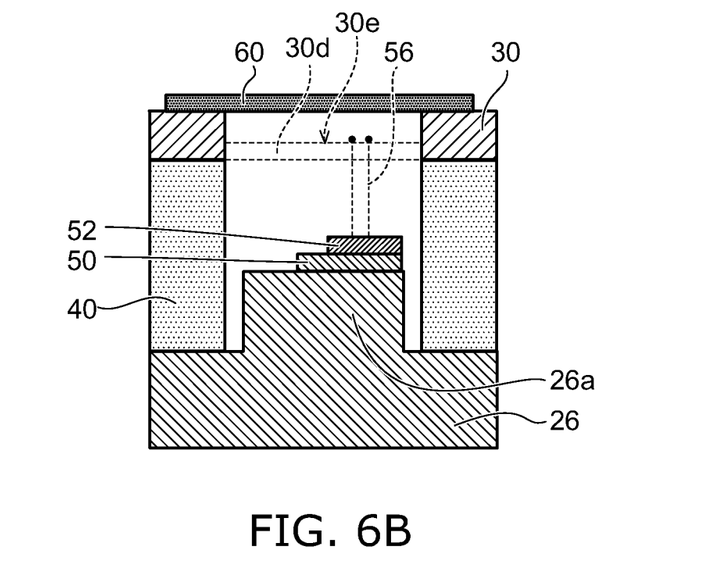

FIG. 6A is a schematic plan view of a light emitting device according to a fourth embodiment. FIG. 6B is a schematic sectional view taken along line A-A.

The step section 30d of the second electrode 30 may be parallel to line A-A. Then, a bonding direction of the semiconductor laser element 52 and the step section 30d and a bonding direction of the conductive layer on the sub-mount 50 and the convex section 26a can be set parallel to each other. Therefore, it is possible to align a moving direction of the capillary and reduce a bonding time.

Figure 7A:
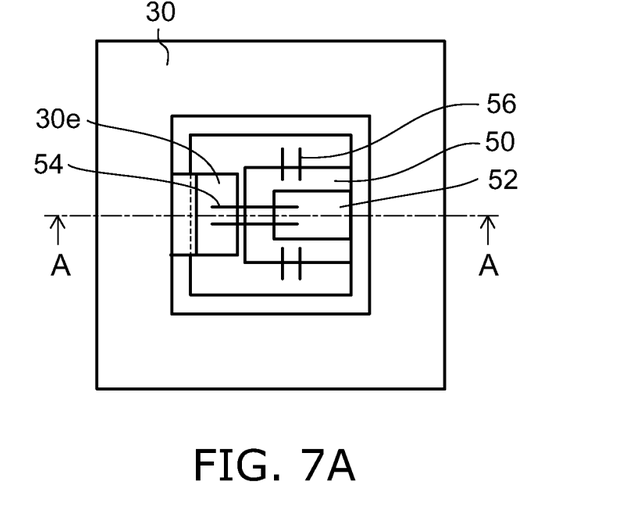
FIG. 7A is a schematic plan view of a light emitting device according to a fifth embodiment and FIG. 7B is a schematic sectional view taken along line A-A.
Figure 7B:
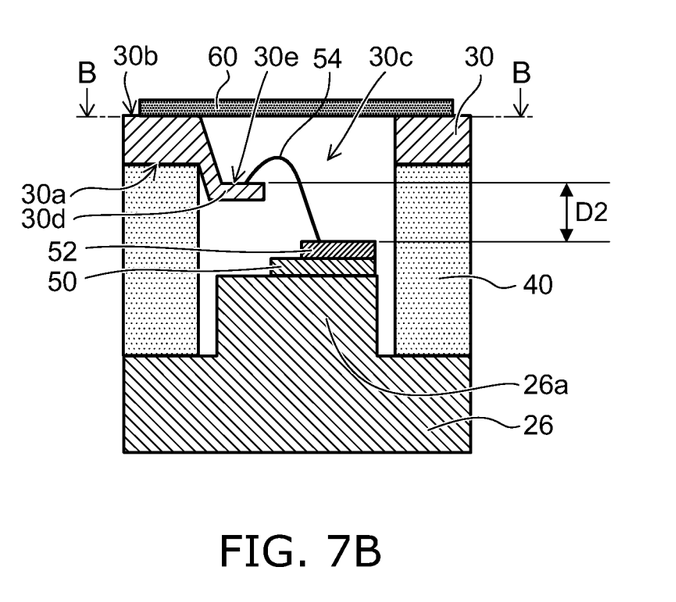

FIG. 7A is a schematic plan view of a light emitting device according to a fifth embodiment. FIG. 7B is a schematic sectional view taken along line A-A.

The upper surface 30e of the step section 30d can be provided below the first surface 30a of the second electrode 30. That is, a distance D2 between the upper surface 30e of the step section 30d and the upper surface of the semiconductor laser element 52 is smaller than the distance in the first embodiment shown in FIG. 1B. In this case, since the step section 30d can be provided on the opposite side of an emitting direction of laser light, an FFP of the laser light is not disordered.

A region formed as the step section 30d can be bent downward by pressing or the like. In the fifth embodiment, the bonding wire 54 can be reduced in length and the light emitting device can be reduced in thickness. Since the bonding wire 54 can be reduced in length, workability in a wire bonding process is high.

Figure 8A:
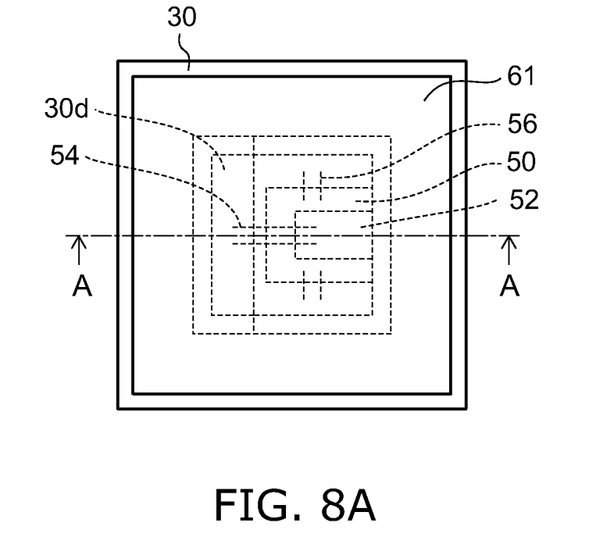
FIG. 8A is a schematic plan view of a light emitting device according to a sixth embodiment and FIG. 8B is a schematic sectional view taken along line A-A.
Figure 8B:
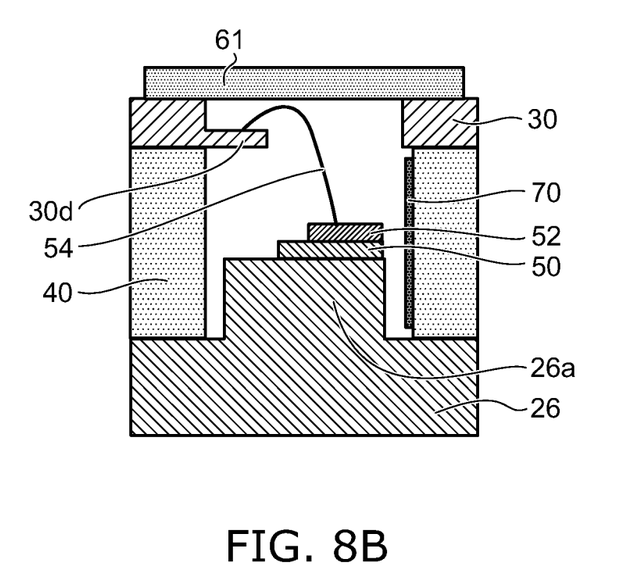

FIG. 8A is a schematic sectional view of a light emitting device according to a sixth embodiment. FIG. 8B is a schematic sectional view taken along line A-A.

When the semiconductor laser element 52 is made of an InGaAlN-based material, the laser light 53 can be set to, for example, a wavelength of blue to bluish purple. When, as shown in FIG. 8B, a yellow phosphor layer 70 is provided in a region where the laser light 53 is transmitted at the inner edge of the transparent frame section 40, white light can be emitted. Alternatively, the yellow phosphor layer 70 may be provided in a region where the laser light 53 is transmitted at the outer edge of the transparent frame section 40. Note that, after the transparent frame section 40 is provided, a transparent resin layer mixed with phosphor particles on the inside may be provided.

According to the first to sixth embodiments, a light emitting device not requiring high component accuracy, rich in mass productivity, and easily reduced in size is provided. Such a light emitting device can be applied to a linear light source and the like. Further, the liner light source can be widely used in a fog lamp for an automobile, a backlight light source of a display device, an optical sensor light source, and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes may be made without departing from the spirit of the inventions. The embodiments and the modifications of the embodiments are included in the scope and the spirit of the inventions and included in the scope of the inventions described in claims and equivalents of the inventions.

REFERENCE SIGNS LIST

26 First electrode
26a Convex section
26b Bottom surface
27 Metal thin plate
30 Second electrode
30a First surface
30b Second surface
30c Opening section 30d Step section
30e Upper surface
40, 41 Transparent frame sections
52 Semiconductor laser element
53 Laser light
54, 56 Bonding wires
60 Lid section
60a Transparent conductive film
Θv Vertical direction full width at half maximum
Θh Horizontal direction full width at half maximum

The invention claimed is:

1. A light emitting device comprising:
    a first electrode including a convex section, a bottom surface surrounding the convex section, and a rear surface on an opposite side of the bottom surface;
    a second electrode including a first surface opposed to the bottom surface of the first electrode and a second surface on an opposite side of the first surface, the second electrode including an opening section and a step section receding in a direction of the first surface from the second surface;
    a semiconductor laser element provided on the convex section and including a light-emitting layer;
    a bonding wire capable of electrically connecting the semiconductor laser element and the step section;
    a transparent frame section surrounding the convex section and the semiconductor laser element and made of glass, the transparent frame section being bonded to the bottom surface and bonded to the first surface of the second electrode; and
    a lid section bonded to the second surface of the second electrode,
    a light component within a full width at half maximum in laser light emitted from the semiconductor laser element being emitted to an outside from the transparent frame section.

2. The device according to claim 1, wherein the lid section has transparency.

3. The device according to claim 2, wherein the lid section includes, on a surface thereof, a transparent conductive film connected to the second electrode.

4. The device according to claim 1, wherein an upper surface of the step section, to which the bonding wire is bonded, is provided below the first surface.

5. The device according to claim 1, wherein the first electrode contains any one of molybdenum, copper, and a copper alloy.

6. The device according to claim 1, wherein the second electrode contains any one of Kovar, iron, and molybdenum.

7. The device according to claim 1, further comprising a metal thin plate provided between the bottom surface of the first electrode and the transparent frame section.

* * * * *